United States Patent [19]
Ko

[11] Patent Number: 5,597,074
[45] Date of Patent: Jan. 28, 1997

[54] PACKING TRAY OF SEMICONDUCTOR DEVICES AND A METHOD FOR MANUFACTURING THE SAME

[76] Inventor: Seung S. Ko, Jugong Apartment 139-504, 10-1 Dunchon-Dong, Kangdong-Ku, Seoul, Rep. of Korea

[21] Appl. No.: 365,553

[22] Filed: Dec. 28, 1994

[30] Foreign Application Priority Data

Apr. 25, 1994 [KR] Rep. of Korea ......................... 94-8583
Nov. 3, 1994 [JP] Japan ..................................... 94-28703

[51] Int. Cl.$^6$ ................................................. B65D 73/02
[52] U.S. Cl. ........................... 206/725; 206/722; 206/724
[58] Field of Search ..................................... 206/564, 722, 206/724, 725; 361/774, 809; 174/52.1, 52.4

[56] References Cited

U.S. PATENT DOCUMENTS

| | | |
|---|---|---|
| 3,494,459 | 2/1970 | Wallestad ................................ 206/725 |
| 5,131,535 | 7/1992 | O'Connor et al. ...................... 206/722 |
| 5,335,771 | 8/1994 | Murphy .................................. 206/725 |
| 5,337,893 | 8/1994 | Nami et al. ............................. 206/722 |
| 5,418,692 | 5/1995 | Nemoto .................................. 206/725 |

*Primary Examiner*—David T. Fidei
*Attorney, Agent, or Firm*—Birch, Stewart, Kolasch & Birch, LLP

[57] ABSTRACT

A packing tray for protecting all kinds of semiconductor packages or chips in the form of a tray-type packing tray, a tube-type packing tray, a reel tape-type packing tray, and a waffle-type packing tray wherein the packing tray is made of paper, paper pulp, and wood, which does not cause pollution when recycling, burning, and disposal in the soil.

6 Claims, 5 Drawing Sheets

FIG. 5
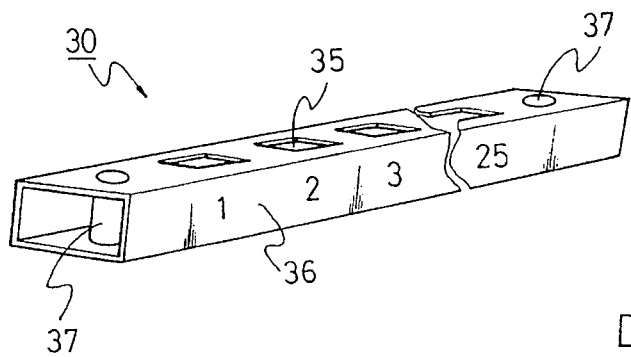
FIG. 6
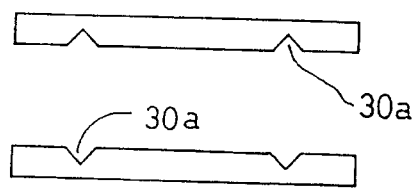
FIG. 7A    FIG. 7B    FIG. 7C
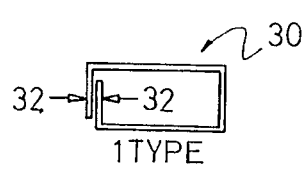 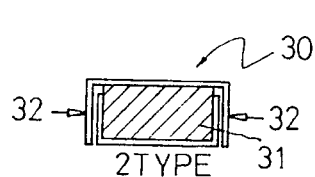 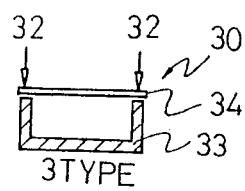
FIG. 8A    FIG. 8B    FIG. 8C    FIG. 8D
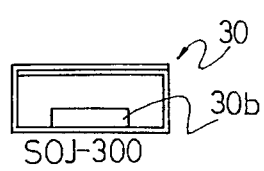 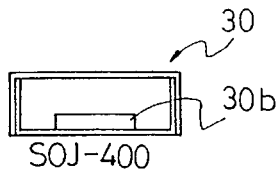 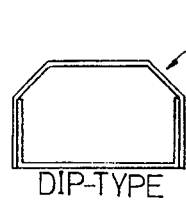 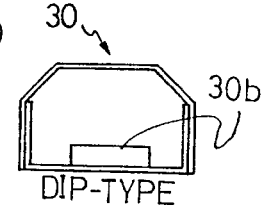
FIG. 8E    FIG. 8F    FIG. 8G
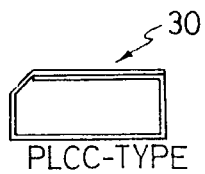 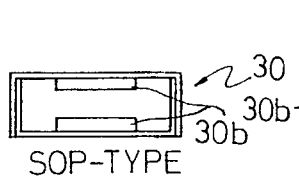 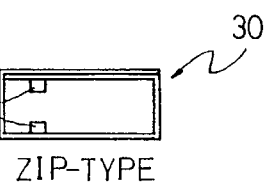

PACKING TRAY OF SEMICONDUCTOR DEVICES AND A METHOD FOR MANUFACTURING THE SAME

BACKGROUND OF THE INVENTION

The present invention relates to a packing tray for a semiconductor package which may be of the tray-type, tube-type, reel tape-type or waffle-type depending upon its shape. More particularly, the present invention is directed to a packing tray for a semiconductor package used to store or deliver all kinds of semiconductor packages or semiconductor chips without damage, and also to the methods of manufacturing the same.

Generally, the semiconductor, which is recently applied in all kinds of electronic goods, can be classified by its exterior shape into DIP(Dual In-Line Package), SOP(Small Outline Package), SIP(Single In-Line Package), SIPH(SIP with heat Sink), ZIP (Zigzag In-Line Package), PLCC(Plastic Leaded Chip Carrier), SOJ (Small Outline J-lead Package), TSOP(Thin Small Outline Package) and QFP(Quad Flat Package).

When the semiconductor packages mentioned above need to be stored or delivered after manufacturing, a packing tray is absolutely required due to their precise, sensitive characteristics.

As a packing tray for semiconductors which are widely used at present, there are, for example patents for materials and manufacturing methods thereof specified in Japanese Patent Laid-open Publication J04334362A(Nov. 12, 1992, 9252) and J050785668A(Mar. 30, 1993, 9317), wherein the tray is manufactured using Plastic Injection or Extrusion Die Apparatus after mixing a certain amount of Carbon black to the basic material Nylon 66-type Resin, or using an Extrusion Die Apparatus after mixing together a certain amount of Carbon and combined material with a type of vinyl.

But these kinds of methods have the following problems: First, Nylon, Vinyl materials, and Carbon Black, used for making packing trays, are pollutants and thus disposal in the soil and burning of the same are impossible. Second, the requirement of expensive metal mold can cause a high increase in the costs of manufacturing and sale. Third, when the application of an imitation requires a change in the metal mold, extra cost as well as difficulty in changing can be a problem. Fourth, the packing tray is relatively low in heat-resistance and cold resistance, and does not absorb impact.

In particular, the high recovery cost of materials may prevent an efficient recycling. Also a widely-used tube-type packing tray is made up of transparent Polyvinyl Chlorides, and a method of metal mold injection is generally used as the manufacturing method. Yet PVC(Poly Vinyl Chloride) as the major material can cause a pollution problem in disposal in the soil or burning.

Because such a packing tray for a semiconductor package is required for storing or delivering semiconductor packages, demand for an effective packing tray has been increasing dramatically due to the development of the semiconductor industry.

But since the Rio Environment Conference in June 1993, the environmental issue is expected to have a great impact on the industry. Accordingly, restrictions will be imposed on exporting the widely-used packing trays for semiconductor package made up of Vinyl, Nylon and Carbon Resin materials.

SUMMARY OF THE INVENTION

The purpose for the present invention is to provide a packing tray of semiconductor packages which create no problem in disposal in the soil, burning as well as other pollution and which can be manufactured using simple facilities by using cheap materials such as paper and wood. The present invention is also concerned with methods of manufacturing the same.

The packing tray of the present invention can be manufactured slightly differently according to the kind of semiconductor package ordered by customer. But the characteristics of static electricity protection, shock-absorbing effect, which are essential characteristics of paper, and high strength, heat-resistance, and cold resistance can be obtained through controlling the adhesive, heating temperature, pressure and manufacturing time in order to protect a semiconductor package.

The packing tray of the present invention is manufactured in a pre-determined shape manufactured by paper or wood, and is then overlapped and combined using an adhesive.

The present invention will become more fully understood from the detailed description given hereinbelow and the accompanying drawings which are given by way of illustration only, and thus, are not limitative of the present invention, and wherein:

BRIEF DESCRIPTION OF THE DRAWINGS

FIG. 5 is a perspective view of a tube-type packing tray as another embodiment of the present invention.

FIG. 6 is a drawing showing the status with a notch at the folding part of the paper applied to tube-type packing tray as another embodiment of FIG. 5.

FIGS. 7A and 7B are cross-sectional views showing how to adhere the folded paper applied to the tube-type packing tray of FIG. 5.

FIG. 7C is a cross-sectional view showing how to adhere transparent or semitransparent adhesive film on wood mold.

FIGS. 8A to 8G are drawings showing the examples applied to tube-type packing trays of FIG. 5.

DESCRIPTION OF THE PREFERRED EMBODIMENTS

The preferred embodiments of the present invention are explained in detail together with the attached drawings.

Figure 1:
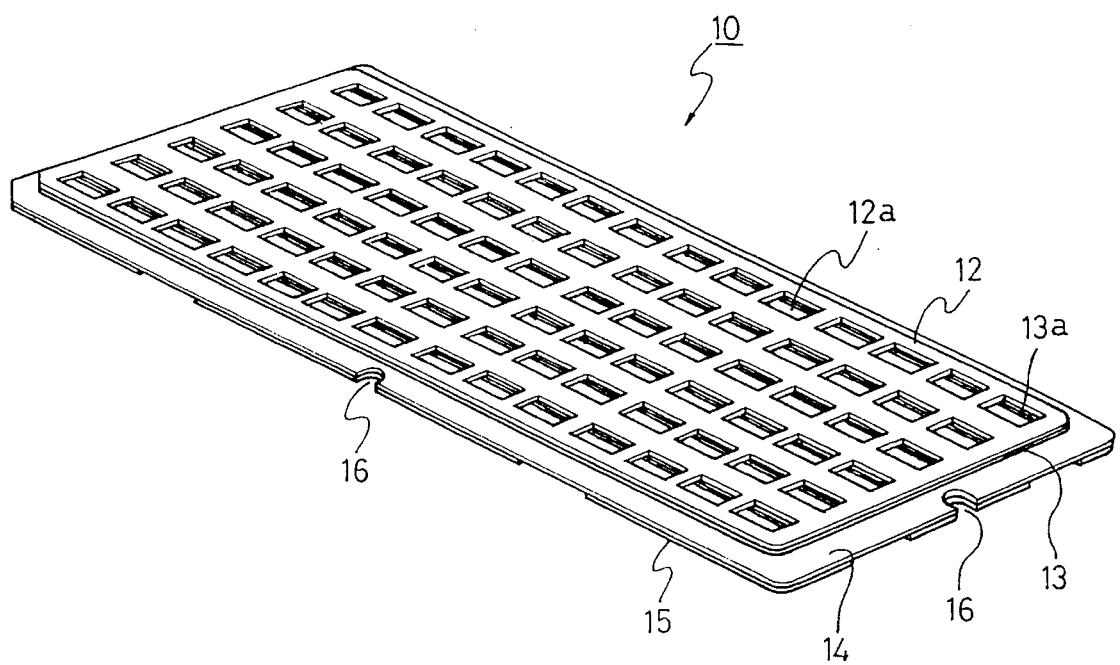
FIG. 1 is the perspective view of tray-type packing tray as are embodiment of the present invention.
Figure 2:
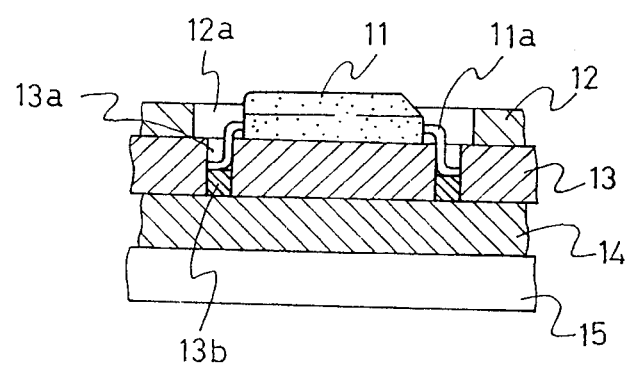
FIG. 2 is the cross-sectional view of the tray-type packing tray shown in FIG. 1 holding a semiconductor package inside.

FIG. 1 shows an entire perspective view of a tray-type packing tray 10 of the present invention. FIG. 2 shows a cross-sectional view of the status holding a semiconductor package 11 inside the packing tray of FIG. 1.

Figure 3:
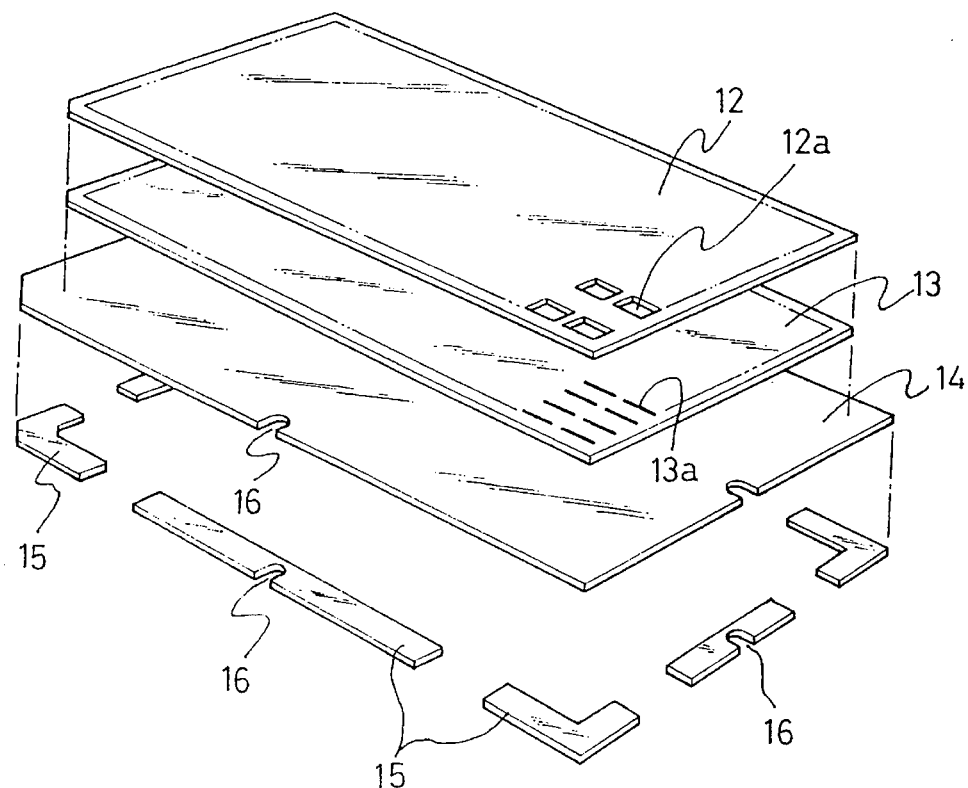
FIG. 3 is the fragmented perspective view of the tray-type packing tray shown in FIG. 1.

FIG. 3 shows a perspective view of each component of the packing tray 10.

The semiconductor package 11, which is manufactured by usual method has shaped leads 11a exposed to both sides. It is well-known that leads 11a are manufactured in a variety of shapes according to the the types of semiconductor packages 11.

As shown in the Figures mentioned above, in a first member 12 of the tray-type packing tray 10 of the present invention, there is punched holes 12a arranged serially in which semiconductor packages 11 can be inserted. In the second member 13 there is provided multiple slots 13a arranged uniformly in which leads 11a of the semiconductor package 11 can be inserted.

The slots 13a are sized with a slight degree of friction force so as not to lose leads 11a of the semiconductor package 11, even in the case of an overturn of the packing tray 10 due to mistreatment. A pair of slots 13a are positioned in a hole 12a arranged in the first member 12. These slots 13a have supporting elements 13b to support and protect the lower face of leads 11a. However, these supporting elements 13b need not be absolutely utilized.

The third element 14 plays the role of a bottom board for the second member 13. The fourth member 15 is manufactured as strip shape to support the packing tray 10, and thus can play the role of a leg by placing itself at the edges of the lower face of the third face 14. At the edges of the third and the fourth members 14 and 15, there are provided notches 16 for automatic transferring and changing the location in the semiconductor facility.

The members 12, 13, 14, and 15 are manufactured respectively by combining a multiplicity of thin papers in a lamination adhesioning method, and holes 12a, slots 13a and notches 16 in each member 12, 13, 14 and 15 can be shaped by conventional Press Molding.

Preferably, the cross-sectional shape of holes 12a of the first member 12 has a trapezoidal shape, and holes can be adhered by spraying an adhesive agent on the adhesive part of each member 12, 13, 14, and 15.

Of course, the number of members 12, 13, 14 and 15 can be reduced by manufacturing one board for each member 12, 13, 14 and 15 instead of two boards for each member. Hence, the number of members 12, 13, 14 and 15 can be reduced to 2 or 3 boards. Or if necessary, it can be increased to 5 boards. Also although not shown in Figures, for reducing the overall weight, more holes can be punched in locations other than the holes 12a of the first member 12 or slots 13a of the second member 13.

In the following, the method for manufacturing the tray-type packing tray 10 of the present invention is explained.

At first, as shown in FIG. 3, after making the first through fourth member 12, 13, 14 and 15 by combining a multiple of thin papers using the lamination adhesioning method, each member 12, 13, 14 and 15 is cut off according to a pre-determined shape or measure by using Press Molding. Thereafter an adhesive agent with heat-resistance, and cold resistance such as PVA adhesive agent, is applied to the adhesive parts of each member 12, 13, 14 and 15 for combining these members.

To present paper twisting, heating temperature ranges of from 20° to 150° C., and 1 to 200 psi pressure is applied for 5 seconds to 20 minutes. To prevent bubble generation, the paper density ranges from 0.9 to 1.2 g/cm$^3$, and pulp or wood instead of paper can be used as a material.

In the case of paper, even though the possibility of static electricity generation is relatively low, an agent for preventing static electricity generation is properly applied by spraying the packing tray 10 to protect with certainly the semiconductor package 11. To prevent deformation of the completed packing tray 10, heat treatment can be applied at 20° C. to 150° C. in an oven for 30 minutes to 36 hours.

Here holes 12a are punched on the first member 12 using Press Molding. The cross-sectional shape of hole 12a is trapezoid: that is, the upper face of hole is wide, and the lower face is narrow. In this case, the size of Press Molding device is changed according to the number of thin papers utilized. After this, the first member 12 can be shaped through overlapping and the adhering together 3 to 6 sheets of paper.

Figure 4:
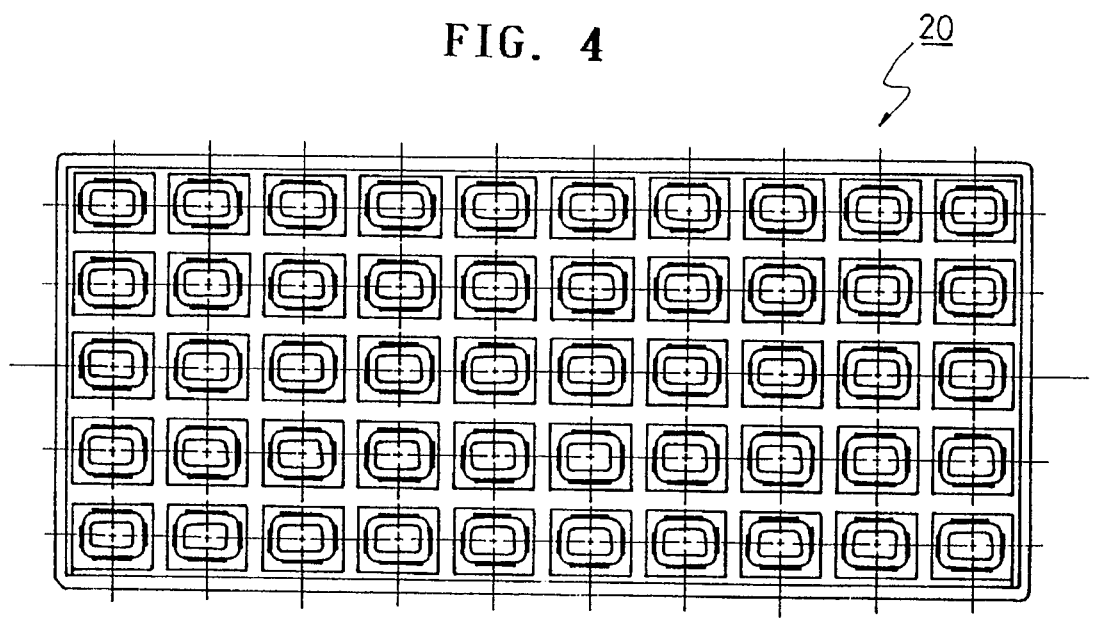
FIG. 4 is a sectional plan showing a varied embodiment of the tray-type packing tray shown in FIG. 1.

FIG. 4 shows a packing tray 20 applicable to a QFP(Quad Flat Package)-type semiconductor package 11, similar to the packing tray 10 shown in FIG. 1. Except for the fact that slots 13a formed in the second member 13 in FIG. 1 to FIG. 3 are formed corresponding to leads 11a shaped on all sides of semiconductor package, the rest of parts have the same structure, and are manufactured by the same method. Thus the detailed explanation thereof is omitted.

In summarizing briefly the manufacturing process of tray-type packing tray 10 and 20, four members 12 to 15, which are formed respectively by combining multiple sheets of thin paper adhesively laminated adhesioning together, are cut off according to a particular specification by a Programmable cutting machine, in the case of small quantity production, and by a Press Molding machine, in the case of mass production. The members are laminated after spraying the adhesive agent on adhesive parts of each member 12 to 15, and are then adhered together by controlling heat, pressure, and time according to the materials of each member 12 to 15 or according to customer's requirements. Surface treatment and printing are applied on the completed packing tray 10 and 20.

FIG. 5 shows an embodiment for a tube-type packing tray 30 for a semiconductor package according to the present invention. To inspect the presence of a semiconductor package in the packing tray 30, an inspection window 35 is formed on the upper face of the substantially square pillar member 30 of the packing tray which is made of paper. The number of inspection windows 35 may be equal to the number of semiconductors, or may be more or less than the number of semiconductors. Serial number, model name or any necessary data 36 can be printed on the sides of the packing tray 30.

When packing of the semiconductor package is completed, the semiconductor package cannot be slipped out by providing at least two or more stopping parts 37 respectively disposed on both side free ends of tube-type packing tray 30. Of course, the type or method of stopping part 37 can be changed in case of need.

The tube-type packing tray 30 can be distinguished easily according to symbol or different color of paper of each model. A preferred color of spray can be applied on the white color of paper.

FIG. 6 shows a pretreatment process for manufacturing a tube-type packing tray 30 shown in FIG. 5, and also shows the status that notch 30a is formed at a folding part of the paper. A notch 30a is formed on the paper by using a knife or blade bonded with a high-speed steel, a cemented carbide, a ceramic or a diamond.

FIGS. 7A to 7C explain the manufacturing method of the SOJ-300 and SOJ-400 type packing tray 30. According to the SOJ-300 type, surface processing is applied to one sheet of 0.5 to 0.7 mm, preferably 0.6 mm thick paper for the prevention of static electricity and deformation. As shown in FIG. 6, notch 30a is made by using a knife or using a blade bonded with high-speed steel, cemented carbide, ceramic or diamond on the folding part of the paper. The paper is folded and adhered using the adhesive agent.

Also according to the SOJ-400 type, except for the fact that the paper strip manufactured with a certain measure is folded and adhered to the inside of packing tray 30 before the folding process, the order of the manufacturing process is the same as that of SOJ-300 type.

FIGS. 7A to 7C show the mutual relationship between the paper part and the adhesive part 32. In particular, in FIG. 7C, the packing tray consists of a transparent or semitransparent adhesive film 34 attached to or detachable from the upper opening part of the mold 33, made of wood. In the case of adhesion of paper and the adhesive part 32, as shown in FIG. 8B, stick 31 is inserted to help adhesion, and then, is taken out.

FIGS. 8A to 8G show the status of the variations of tube-type packing tray 30 suitable for all types of semiconductor packages. Types of (A), (E), and (G) are formed by folding a sheet of paper. In types (A), (B), (D), (F) and (G), the projecting part 30b is formed to support the semiconductor package. Types (B), (C), (D) and (F) are shaped by adhering two folded and overlapped sheets of paper together using the kind of adhesive agent mentioned above. Here it is possible to omit projecting part 30b, but it is desired to have a projecting part for safer protection of the semiconductor package.

Among semiconductor packages mentioned above, SOP type with a relatively complex shape has two additional projecting parts 30b in the manufacturing process of packing tray 30 of the semiconductor packing trays 30 such as SOJ-300 and SOJ-400.

These two additional projecting parts 30b are used to prevent up-and-down movement of the semiconductor package, which can be formed by adhering the paper strip manufactured according to the desired measure.

Also according to DIP-300 type, the packing tray 30 with a desired angle and shape can be manufactured by controlling the pressure of the knife blade in accordance with the angle of the folded part thereof or by adhering the knife blade to the upper and lower parts of the metal mold according to the folded part.

Among semiconductor packages, the manufacturing method and shape of the packing tray 30 of SIP-type, SIPH-type, ZIP-type and PLCC-type are almost similar to those mentioned above, and so a detailed explanation thereof is omitted.

Explaining briefly the manufacturing process of the tube-type packing tray 30, having the various shapes as shown in FIG. 8 is selected in accordance with the dimension and shape thereof. The overall external shape and inspection window 35 are manufactured by Press Molding or the Universal cutting machine. The notch is shaped on each folded part using a knife or blade bonded with High-Speed Steel, Cemented Carbide, Ceramic or Diamond. After then, the adhesive agent is sprayed on the folded part of the paper like a general packing machine. Stick 31 is inserted inside the packing tray to prevent shape deformation. The packing tray can be manufactured by applying the adhesive part with 1 to 200 psi pressure within a temperature of 20° to 150° C. for 5 seconds to 20 minutes.

As described above, for paper, even though its possibility of static electricity generation is relatively low, it is desired that an agent for static electricity prevention is properly sprayed on the packing tray 30 to absolutely protect the semiconductor package. According to the proper surface treatment conditions of the packing tray 30, heat treatment can be applied in a 20° to 150° C. oven for 30 minutes to 36 hours, and the printing procedure can be included.

Figure 9A:
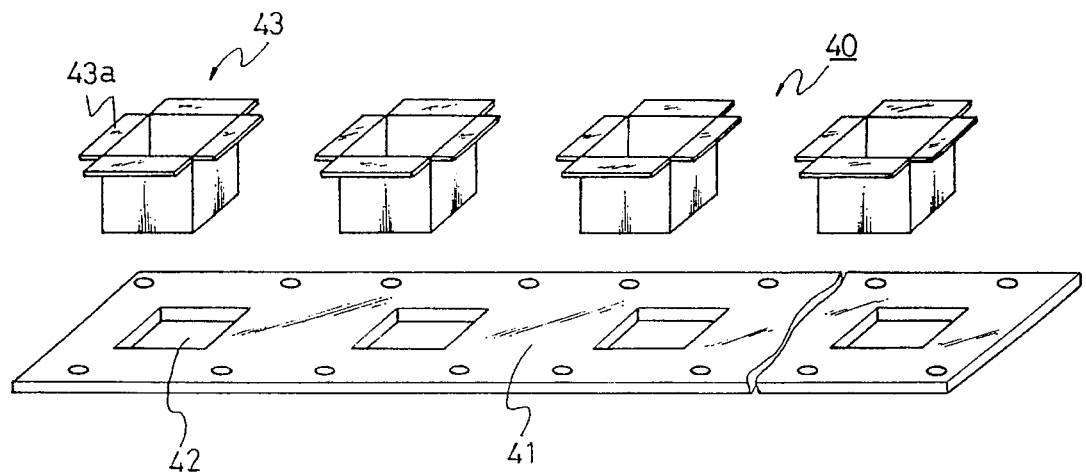
FIGS. 9A and 9B are the drawings of a reel tape-type packing tray as another embodiment of the present invention.
Figure 9B:
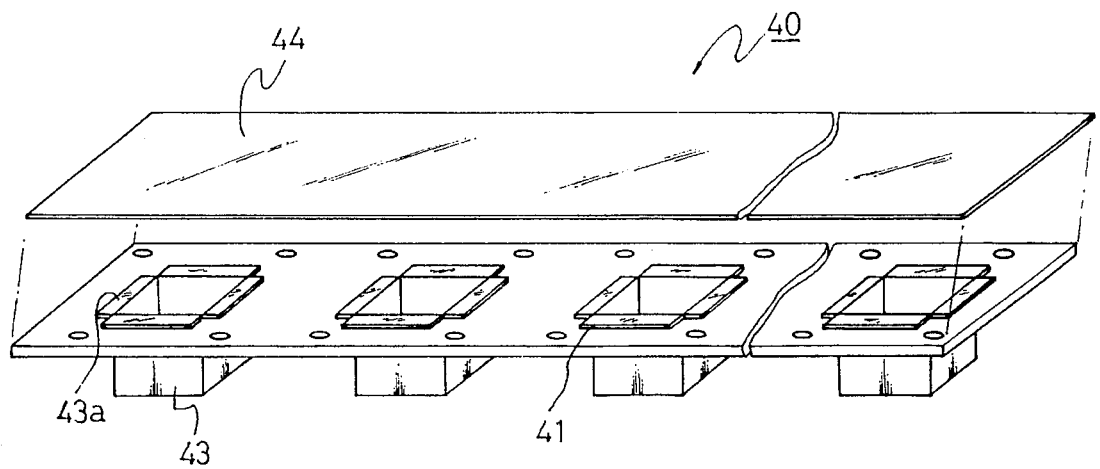

FIGS. 9A and 9B show a reel tape-type packing tray 40 for semiconductor packages according to another embodiment of the present invention. A multiplicity of holes 42 are punched and spaced at a certain distance in a flat-type base board 41, and pre-determined shape boxes 43 in which the semiconductor packages are to be inserted is fitted into holes 42 of the base board 41. Wing 43a provided at opening part of the box 43 is adhered to base board 41 with an adhesive agent, and a transparent or semitransparent adhesive film 44 is adhered around the opening part of the box 43.

In manufacturing the reel tape-type packing boxes 40, boxes 43 to be inserted into the semiconductor package are manufactured using a separate automatic folding machine. A multiple of holes 42 are cut in the flat-type base board 41 by using Press Molding or a universal cutting machine.

The adhesive agent is sprayed on the back side of wing 43a formed at the opening part of the box 43, and the box is inserted into hole 42 of the base board 41 and adhered thereto. A transparent or semitransparent adhesive film 44 is adhered around the opening part of the box 43. It is desired that the semiconductor package manufactured is inserted inside the box 43 automatically before the adhesive film 44 is adhered thereto, but the semiconductor package can be inserted after the existing adhesive film 44 is removed.

Figure 10A:
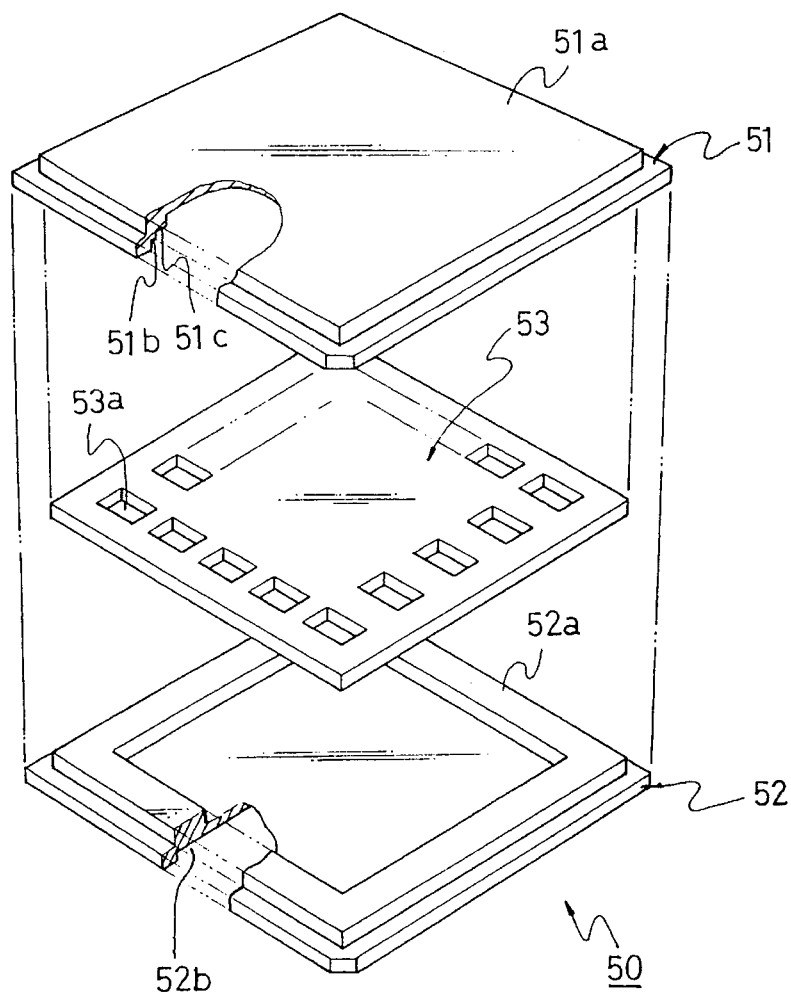
FIGS. 10A and 10B are Perspective and cross-sectional views of a waffle-type packing tray as another embodiment of the present invention.
Figure 10B:
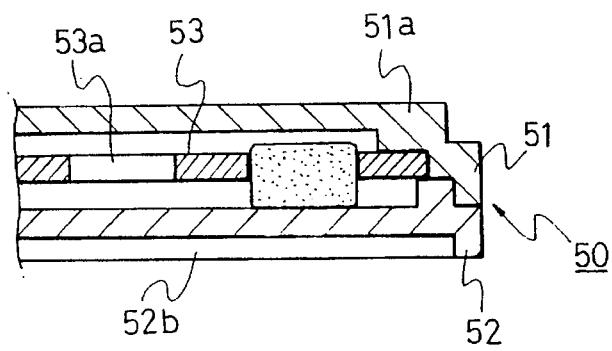

FIGS. 10A and 10B show a waffle-type packing tray 50 suitable for packing semiconductor chips. The packing tray 50 is composed of a cover board 51, a piling board 52 receiving the cover board 51 and provided with predetermined inserting parts 52a on its upper part 51, a depth piling notch 52b on its lower surface respectively, and a subsidiary board 53 mounted between the cover board 51 and the piling board 52 and provided with multiple holes 53a at predetermined distances to fix the inserting position of the semiconductor chips.

Also the first and the second stepping parts 51b and 51c are shaped respectively at the inner periphery of the cover board 51, whereby, when the cover board 51 is inserted into the piling board 52, inserting part 52a disposed on the upper part of piling board 52 is supported by the first stepping part 51b inside cover board 51, and the position of subsidiary board 53 is fixed by being supported by the second stepping part 51c of the cover board 51. Each member is shaped by paper, as shown in the embodiment described above, and the pre-determined depth member is formed by combining multiple sheets of thin paper using the lamination adhesioning method, and can be formed of wood or pulp.

In manufacturing this waffle-type packing tray 50, each member, which is formed by combining multiple sheets of thin paper using the lamination-adhesioning method, is at first cut by Press Molding to a pre-determined shape, and then the cover board 51, the piling board 52 and the subsidiary board 53 are made by adhering each member together after the adhesive agent is sprayed on the adhesive part thereof. To prevent twisting of paper, 1 to 200 psi pressure is applied for adhesioning with a heating temperature of 20° to 150° C. for 5 seconds to 20 minutes.

Also for paper, even though its possibility for static electricity generation is relatively low, it is desired that an agent for preventing static electricity prevention is properly sprayed on the packing tray 50 to protect the semiconductor chip. To prevent deformation of the completed packing tray 50, heat treatment can be applied in 20° to 150° C. in an oven for 30 minutes to 36 hours.

In the embodiments described above, according to the kind of semiconductor package, only trays to pack these semiconductor packages or semiconductor chip were explained. But it is clear that other variations possible within the range of the present invention are feasible.

Since the packing tray for the semiconductor packages of the present invention is made of paper, wood or pulp, recycling or burning is possible without polluting the environment. The packing tray has characteristics of heat-resistance, cold resistance, shock-absorption, high strength, and a variety of colors. Non-standardized or customer-made production is possible, and damage of the semiconductor package resulting from static electricity can be avoided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A packing tray for semiconductor packages comprising:

a first member provided with a multiplicity of serially-punched quadrilateral holes in which semiconductor packages can be inserted and fixed therein, a second member adhered to a lower face of the first member by an adhesive agent and having slots punched therein corresponding to each of said holes for accommodating and fixing therein the leads of said semiconductor packages to be inserted therein, a third member adhered to a lower face of the second member by an adhesive agent to cover the bottom face of each slot, and also to function as a bottom board for the second member, and a fourth member adhered to the periphery of a bottom face of the third member to act as a leg therefor.

2. The packing tray for semiconductor packages according to claim 1, wherein the first to the fourth members are made up of paper, and the members are formed by combining multiple sheets of thin paper using a lamination-adhesioning method.

3. The packing tray for semiconductor packages according to claim 1, wherein the cross-sectional shape of the holes provided in the first member is trapezoidal, having an upper part which is wide and a lower part which is narrow, and the first member is made by laminating multiple sheets of paper.

4. The packing tray for semiconductor packages according to claim 2, wherein the first to the fourth members are made of wood or pulp.

5. The packing tray for semiconductor packages according to claim 3, wherein, in the first to the fourth members the paper density ranges from 0.9 $g/cm^3$ to 1.2 $g/cm^3$ to prevent bubble generation.

6. The packing tray for semiconductor packages according to claim 1, wherein, in the first to the third members, additional holes are punched to minimize the weight of the packing tray.

* * * * *